United States Patent [19]

Fein

[11] 3,982,155

[45] Sept. 21, 1976

[54] SATURATED PHOTON CONDITIONING OF MULTIPLE GASEOUS DISCHARGE PANEL

[75] Inventor: Michael E. Fein, Toledo, Ohio

[73] Assignee: Owens-Illinois, Inc., Toledo, Ohio

[22] Filed: May 18, 1972

[21] Appl. No.: 254,648

[52] U.S. Cl. .................... 315/169 TV; 315/169 R
[51] Int. Cl.$^2$ .......................... H05B 37/00
[58] Field of Search .................. 315/169 R, 169 TV

[56] References Cited
UNITED STATES PATENTS

| | | |
|---|---|---|
| 3,499,167 | 3/1970 | Baker et al. ................ 315/169 TV |
| 3,618,071 | 11/1971 | Johnson ..................... 315/169 R X |

Primary Examiner—R. V. Rolinec
Assistant Examiner—Lawrence J. Dahl
Attorney, Agent, or Firm—Donald Keith Wedding

[57] ABSTRACT

There is disclosed the saturated photon conditioning of a multiple gas discharge device by the provision of a sufficient flux of conditioning photons at each to-be-conditioned cell such that the necessary writing pulse amplitude for each cell is reduced to a minimum level. More particularly, there is provided a conditioning photon flux sufficient to reduce the necessary write voltage of the cell to such a level that the provision of more conditioning photons would not significantly further reduce the amplitude of the required writing pulse.

3 Claims, 6 Drawing Figures

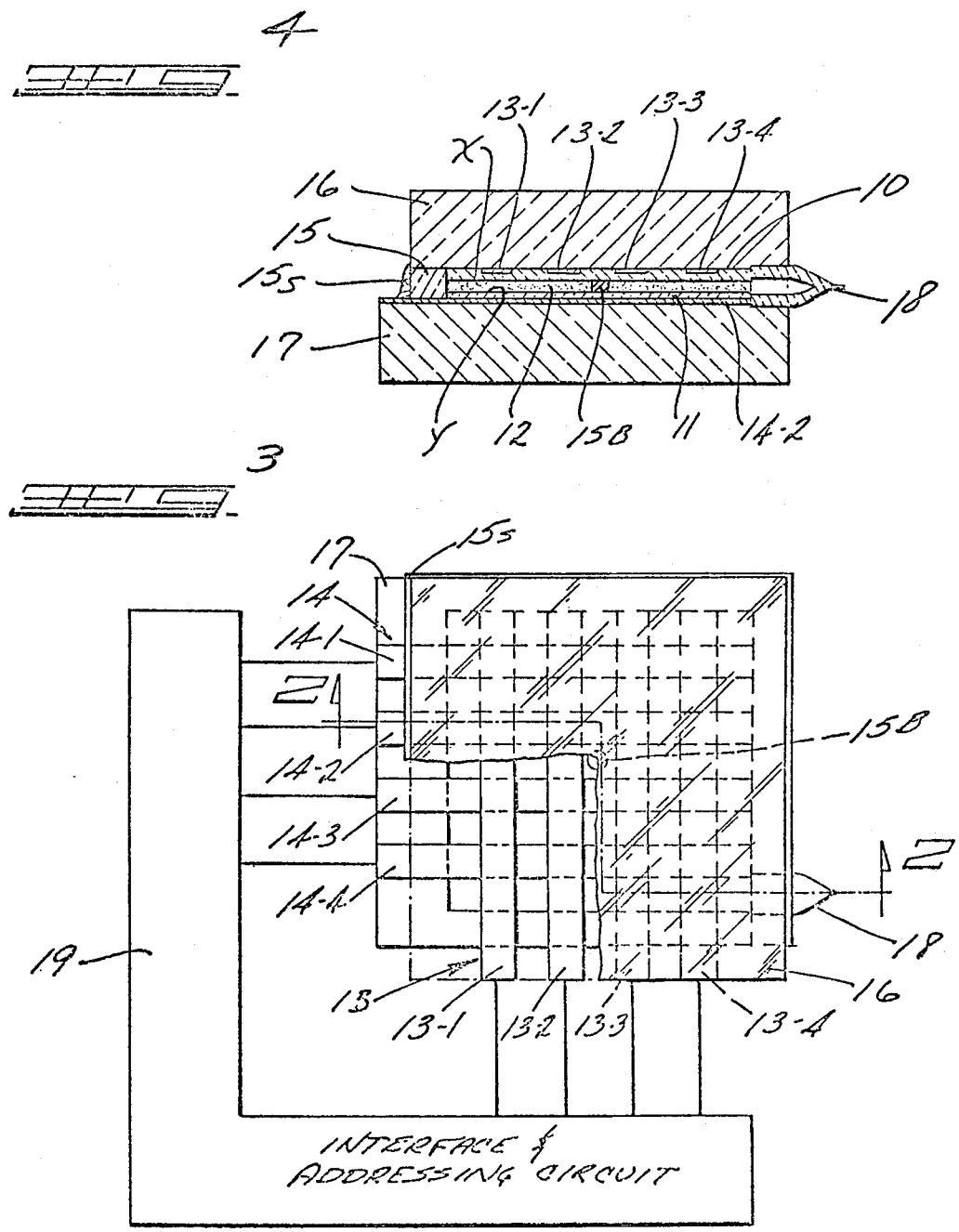

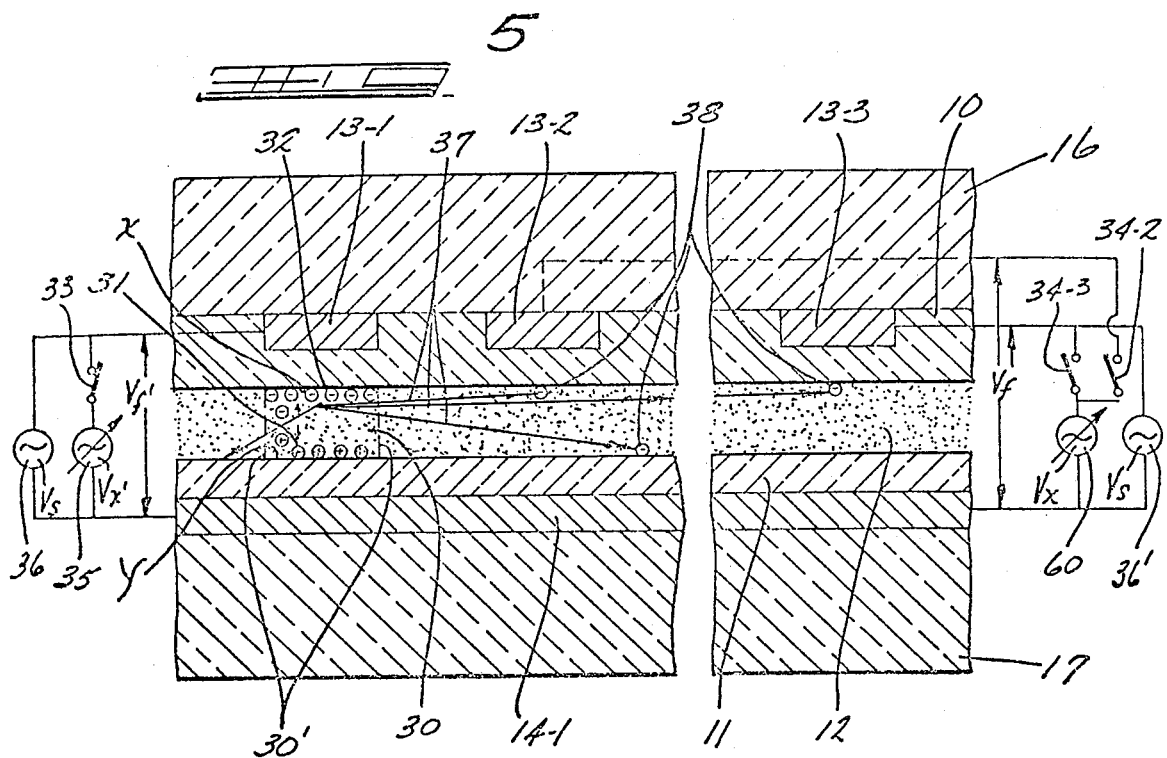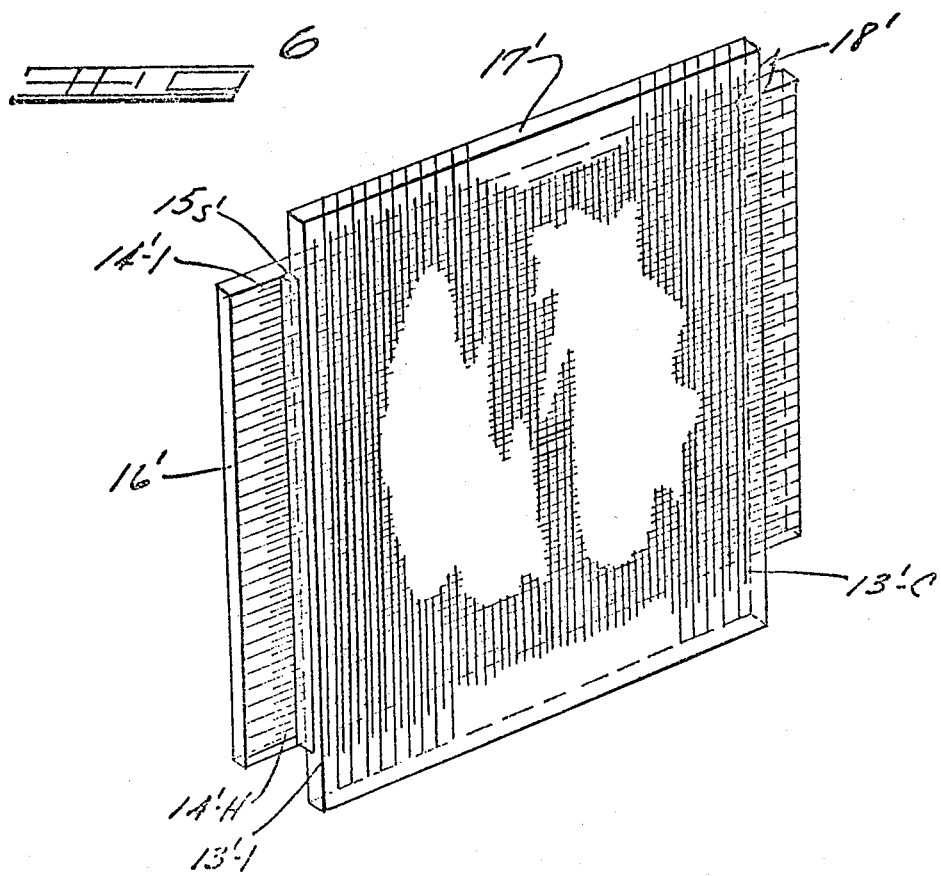

SATURATED PHOTON CONDITIONING OF MULTIPLE GASEOUS DISCHARGE PANEL

BACKGROUND OF THE INVENTION

This invention relates to the photon conditioning of multiple gas discharge devices, especially multiple gas discharge display/memory devices which have an electrical memory and which are capable of producing a visual display or representation of data such as numerals, letters, radar displays, aircraft displays, binary words, educational displays, etc.

Multiple gas discharge display and/or memory panels of one particular type with which the present invention is concerned are characterized by an ionizable gaseous medium, usually a mixture of at least two gases at an appropriate gas pressure, in a thin gas chamber or space between a pair of opposed dielectric charge storage members which are backed by conductor (electrode) members, the conductor members backing each dielectric member typically being appropriately oriented so as to define a plurality of discrete gas discharge units or cells.

In some prior art panels the discharge cells are additionally defined by surrounding or confining physical structure such as apertures in perforated glass plates and the like so as to be physically isolated relative to other cells. In either case, with or without the confining physical structure, charges (electrons, ions) produced upon ionization of the elemental gas volume of a selected discharge cell, when proper alternating operating potentials are applied to selected conductors thereof, are collected upon the surfaces of the dielectric at specifically defined locations and constitute an electrical field opposing the electrical field which created them so as to terminate the discharge for the remainder of the half cycle and aid in the initiation of a discharge on a succeeding opposite half cycle of applied voltage, such charges as are stored constituting an electrical memory.

Thus, the dielectric layers prevent the passage of substantial conductive current from the conductor members to the gaseous medium and also serve as collecting surfaces for ionized gaseous medium charges (electrons, ions) during the alternate half cycles of the A.C. operating potentials, such charges collecting first on one elemental or discrete dielectric surface area and then on an opposing elemental or discrete dielectric surface area on alternate half cycles to constitute an electrical memory.

An example of a panel structure containing non-physically-isolated or open discharge cells is disclosed in U.S. Pat. No. 3,499,167 issued to Theodore C. Baker, et al.

An example of a panel containing physically isolated cells is disclosed in the article by D. L. Bitzer and H. G. Slottow entitled "The Plasma Display Panel — A Digitally Addressable Display With Inherent Memory," Proceeding of the Fall Joint Computer Conference, IEEE, San Francisco, Cal., Nov. 1966, pp. 541–547. Also reference is made to U.S. Pat. No. 3,559,190.

In the construction of the panel, a continuous volume of ionizable gas is confined between a pair of dielectric surfaces backed by conductor arrays typically forming matrix elements. The cross conductor arrays may be orthogonally related (but any other configuration of conductor arrays may be used) to define a plurality of opposed pairs of charge storage areas on the surfaces of the dielectric bounding or confining the gas. Thus, for a conductor matrix having H rows and C columns the number of elemental discharge cells will be the product $H \times C$ and the number of elemental or discrete areas will be twice the number of such elemental discharge cells.

In addition, the panel may comprise a so-called monolithic structure in which the conductor arrays are created on a single substrate and wherein two or more arrays are separated from each other and from the gaseous medium by at least one insulating member. In such a device the gas discharge takes place not between two opposing electrodes, but between two contiguous or adjacent electrodes on the same substrate; the gas being confined between the substrate and an outer retaining wall.

It is also feasible to have a gas discharge device wherein some of the conductive or electrode members are in direct contact with the gaseous medium and the remaining electrode members are appropriately insulated from such gas, i.e., at least one insulated electrode.

In addition to the matrix configuration, the conductor arrays may be shaped otherwise. Accordingly, while the preferred conductor arrangement is of the crossed grid type as discussed herein, it is likewise apparent that where a maximal variety of two dimensional display patterns is not necessary, as where specific standardized visual shapes (e.g., numerals, letters, words, etc.) are to be formed and image resolution is not critical, the conductors may be shaped accordingly, i.e., a segmented display.

The gas is one which produces visible light or invisible radiation which stimulates a phosphor (if visual display is an objective) and a copious supply of charges (ions and electrons) during discharge.

In prior art, a wide variety of gases and gas mixtures have been utilized as the gaseous medium in a gas discharge device. Typical of such gases include $CO$; $CO_2$; halogens; nitrogen; $NH_3$; oxygen; water vapor; hydrogen; hydrocarbons; $P_2O_5$; boron fluoride, acid fumes; $TiCl_4$; Group VIII gases; air; $H_2O_2$; vapors of sodium, mercury, thallium, cadmium, rubidium, and cesium; carbon disulfide; laughing gas; $H_2S$; deoxygenated air; phosphorus vapors; $C_2H_2$; $CH_4$; naphthalene vapor; anthracene; freon; ethyl alcohol; methylene bromide; heavy hydrogen; electron attaching gases; sulfur hexafluoride; tritium; radioactive gases; and the rare or inert gases.

In one preferred embodiment hereof the medium comprises at least one rare gas, more preferably at least two, selected from helium, neon, argon, krypton, or xenon.

In an open cell Baker, et al. type panel, the gas pressure and the electric field are sufficient to laterally confine charges generated on discharge within elemental or discrete dielectric areas within the perimeter of such areas, especially in a panel containing non-isolated discharge cells. As described in the Baker, et al. patent, the space between the dielectric surfaces occupied by the gas is such as to permit photons generated on discharge in a selected discrete or elemental volume of gas to pass freely through the gas space and strike surface areas of dielectric remote from the selected discrete volumes, such remote, photon struck dielectric surface areas thereby emitting electrons so as to condition at least one elemental volume other than the elemental volume in which the photons originated.

With respect to the memory function of a given discharge panel, the allowable distance or spacing between the dielectric surfaces depends, inter alia, on the frequency of the alternating current supply, the distance typically being greater for lower frequencies.

While the prior art does disclose gaseous discharge devices having externally positioned electrodes for initiating a gaseous discharge, sometimes called "electrodeless discharge," such prior art devices utilized frequencies and spacing or discharge volumes and operating pressures such that although discharges are initiated in the gaseous medium, such discharges are ineffective or not utilized for charge generation and storage at higher frequencies; although charge storage may be realized at lower frequencies, such charge storage has not been utilized in a display/memory device in the manner of the Bitzer-Slottow or Baker, et al. invention.

The term "memory margin" is defined herein as $$M.M. = \frac{V_f - V_E}{V_f/2}$$

where $V_f$ is the half amplitude of the smallest sustaining voltage signal which results in a discharge every half cycle, but at which the cell is not bi-stable and $V_E$ is the half amplitude of the minimum applied voltage sufficient to sustain discharges once initiated.

It will be understood that the basic electrical phenomenon utilized in this invention is the generation of charges (ions and electrons) alternately storable at pairs of opposed or facing discrete points or areas on a pair of dielectric surfaces backed by conductors connected to a source of operating potential. Such stored charges result in an electrical field opposing the field produced by the applied potential that created them and hence operate to terminate ionization in the elemental gas volume between opposed or facing discrete points or areas of dielectric surface. The term "sustain a discharge" means producing a sequence of momentary discharges, at least one discharge for each half cycle of applied alternating sustaining voltage, once the elemental gas volume has been fired, to maintain alternate storing of charges at pairs of opposed discrete areas on the dielectric surfaces.

As used herein, a cell is in the "on state" when a quantity of charge is stored in the cell such that on each half cycle of the sustaining voltage, a gaseous discharge is produced.

In addition to the sustaining voltage, other voltages may be utilized to operate the panel, such as firing, addressing, and writing voltages.

A "firing voltage" is any voltage, regardless of source, required to discharge a cell. Such voltage may be completely external in origin or may be comprised of internal cell wall voltage in combination with externally originated voltages.

An "addressing voltage" is a voltage produced on the panel X - Y electrode coordinates such that at the selected cell or cells, the total voltage applied across the cell is equal to or greater than the firing voltage whereby the cell is discharged.

A "writing voltage" or "write voltage" is an addressing voltage of sufficient magnitude to make it probable that on subsequent sustaining voltage half cycles, the cell will be in the "on" state.

It must be explained that it is possible to have a write voltage $V_\omega$ which is not large enough in amplitude to ensure transferring a cell to the on state in 100% of a series of trials. We define $V_{\omega\ 100}$ as the minimum write voltage amplitude sufficient to guarantee near 100% success. The qualifier "near" is necessary because the initiation of a gas discharge is a statistical process, which can be very certain, but never absolutely certain.

It is well known that the initiation of a gas discharge requires not only the application of a voltage across the gas, but also the presence of "starting electrons," which can be accelerated by the voltage. A common method of providing these electrons is to operate in the vicinity of the gas discharge to be initiated, one or more other gas discharges, whose function is to emit photons which, upon striking material surfaces in the vicinity of the cell site where a discharge is to be initiated, will photoelectrically create starting electrons. We refer to this method as "photon conditioning."

If the rate of production of starting electrons is low, it is easy to observe a so-called "statistical lag" — a period after the application of voltage before enough starting electrons have appeared to initiate the discharge. This lag can be reduced either by increasing the applied voltage (thereby increasing the likelihood that any particular starting electron will initiate a discharge) or by increasing the supply of starting electrons. (See for example G. F. Weston, Cold Cathode Glow Discharge Tubes, London ILIFFE Books Ltd., 1968. FIG. 5.2, page 156.)

It will be clear that if a discharge is to be initiated reliably with a brief pulse of applied voltage, the statistical lag must be made substantially less than the pulse width. This effect may be achieved either by using a high-voltage pulse or by providing a copious supply of starting electrons. The practice of this invention comprises the providing of a copious supply of starting electrons by means of saturated photon conditioning so as to improve the performance of a gas discharge device.

More particularly, there is disclosed the saturated photon conditioning of a multiple gas discharge device by the provision of a sufficient flux of conditioning photons at each to-be-conditioned cell such that the necessary writing pulse amplitude for each cell is reduced to a minimum level.

Still more particularly, in accordance with this invention, there is provided a conditioning photon flux sufficient to reduce the necessary write voltage of the cell to such a level that the provision of more conditioning photons would not significantly further reduce the amplitude of the required writing pulse.

It has been discovered that the utilization of such saturated photon conditioning has several advantages including the tendency to improve the uniformity of panel operation and also the tendency to decrease the required sustaining voltage. Other advantages may also result.

In the practice of this invention, saturated photon conditioning is measured by observing the minimum write voltage required to write one or more selected cells of the panel. Typically, the selection is made at or near the center of the panel matrix since the center cells are usually the most difficult to condition and to write.

After such cells are selected, the panel is subjected to conditioning light intensity sufficient to achieve saturated photon conditioning.

The conditioning light intensity (photon flux) may be increased by any one or more of several means:
a. increasing the driving voltage on the conditioning discharge or discharges;
b. increasing the area of the conditioning discharge or discharges;
c. varying the gas mixture;
d. optimizing the timing of a pulse of conditioning light such that the conditioning photon flux peaks in intensity at the start of a write pulse so that the photoelectrons will be maximally useful in initiating the discharge.

Alternatively, the "effective light intensity" may be increased by varying either gas composition or the surface composition and processing so as to provide a more optimum match between the photon wavelengths and the photoemissive yield curve of the surface; thus a given photon flux will provide a larger number of starting electrons.

In any event, this invention requires that, by any available means, the conditioning light intensity or photon flux be made high enough so as to approach saturation at the worst-conditioned discharge cell site in the panel. Then all other discharge sites will exhibit saturated or near-saturated conditioning as well. The advantages of this invention are:
1. The voltage necessary to address any desired site in the device is minimized.
2. The elimination of non-uniformities in operation of different sites in the device which may be attributable to non-uniformity of conditioning.
3. In a matrix-addressed device, wherein many nonaddressed discharge cell sites see half the voltage which appears at the addressed site, the invention reduces the danger that a well-conditioned cell may fire on ½ $V\omega$ where $V\omega$ is the voltage required to fire an ill-conditioned site.

BRIEF DESCRIPTION OF THE DRAWINGS

The above and other objects, advantages and features of the invention will be more fully apparent from the following detailed description and accompanying drawings wherein:

FIG. 3 is a partially cut-away plan view of a gaseous discharge display-memory panel emboding the invention as connected to a diagrammatically illustrated source of operating potentials (which corresponds to FIG. 1 of Baker et al., U.S. Pat. No. 3,499,167), FIG. 4 is a cross-sectional view (enlarged, but not to proportional scale) and corresponds to FIG. 2 of said Baker et al. patent, FIG. 5 is an exemplary partial cross-sectional view similar to FIG. 4, illustrating the concept of photon conditioning described above and also corresponding to FIG. 3 of Baker et al. patent.

The experimental observation upon which this invention is based is that a plot of the minimum required writing voltage pulse height for reliably writing a selected cell approximately 100% of the time versus conditioning light intensity exhibits saturation. This is illustrated by the curve in FIG. 1.

Presumably, this saturation results from the creation of enough starting electrons to make the statistical lag much less than the pulse width. At very high starting electron density, space charge would cause a departure from the saturated level, but it would be difficult to reach such a high density.

In the preferred practice of this invention, the saturated photon conditioning is achieved by the use of so-called pilot cells which are in the on state. Typically, these cells are located at the border or the perimeter of the panel matrix and are controlled by a separate sustaining signal of higher potential than that supplied to the remaining (dynamic) portion of the panel.

Figure 1:
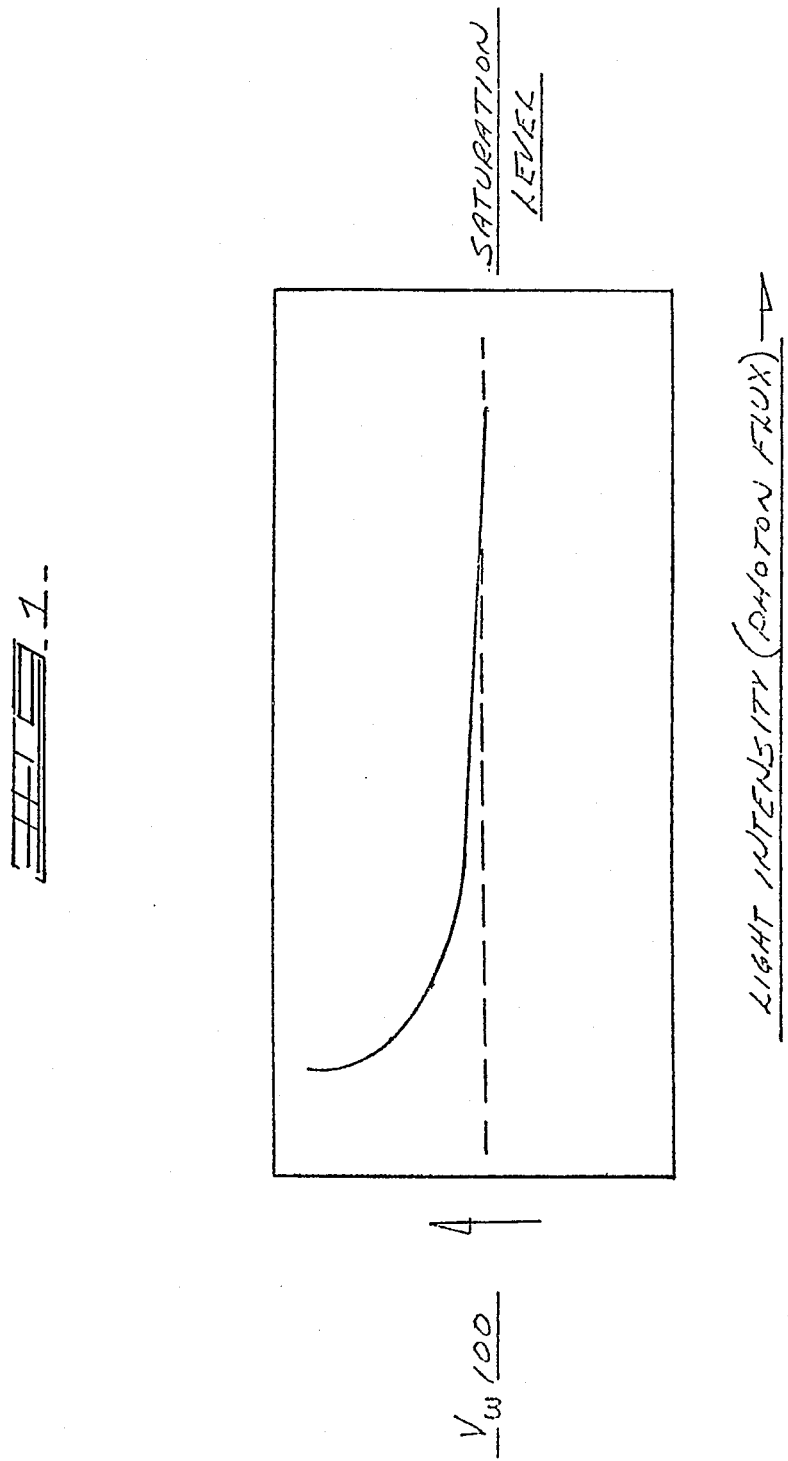
FIG. 1 is a plot illustrating the reliable writing of a selected cell 100% of the time against the conditioning light intensity (photon flux)
Figure 2:
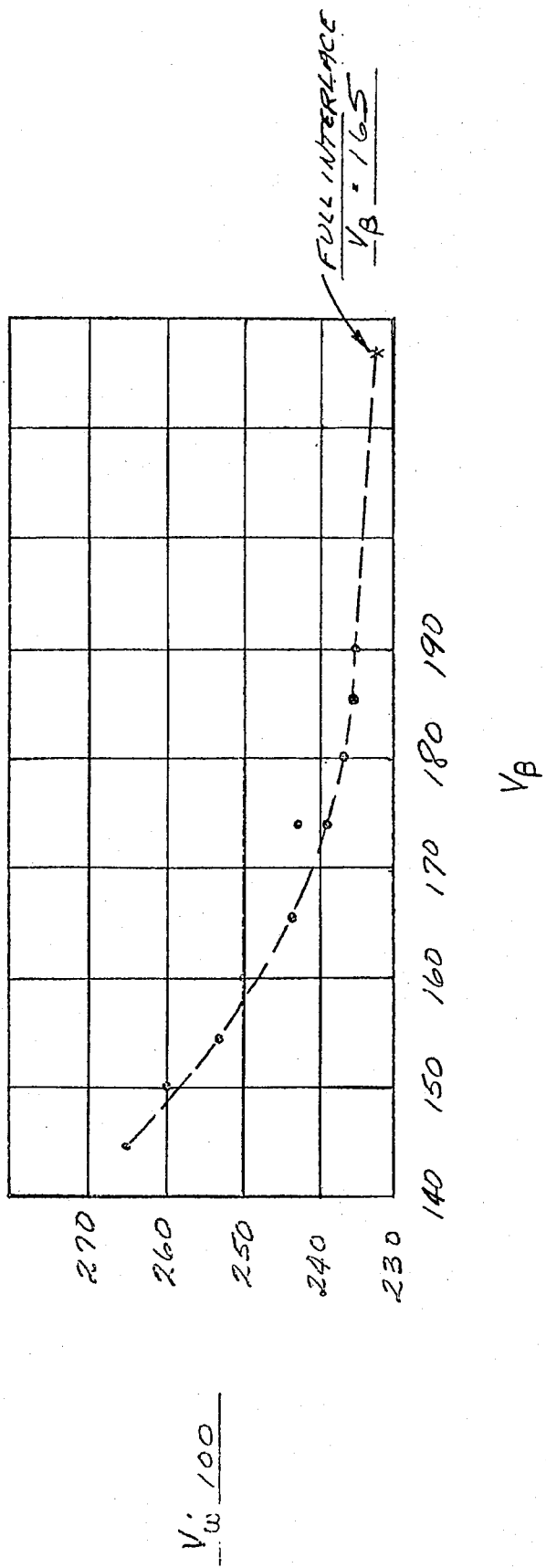
FIG. 2 is a plot of a specific experimental demonstration of the concept shown in FIG. 2 wherein the required write voltage for a selected cell is plotted against the sustaining voltage applied to a selected number of pilot cells in the border of the panel.

In FIG. 2 there is illustrated a specific experimental demonstration of the concept generally illustrated by FIG. 1. More especially there is illustrated in FIG. 2 a plot of the required write voltage $V\omega_{100}$ for a selected cell versus the sustaining voltage $V_B$ applied to six rows of pilot cells in one border edge of the panel. The size of the display area of the panel was approximately 4 by 4 inches and comprised 128 electrodes along each column or row axis, 33 lines per inch. The number of pilot cells in the six border rows was 768. The selected cell was about 3.81 inches from the pilot border edge. The panel was filled with a neon-argon gas composition. The sustaining signal potential $V_B$ applied to the border pilot cells was gradually increased in amplitude, it being believed that the conditioning photon flux increased monotonically with $V_B$. As the $V_B$ applied to the pilot cells was increased, the required writing voltage magnitude gradually decreased, appearing to approach an assymptote at about 234 volts.

In order to verify the saturated photon conditioning had been truly achieved, it was desirable to increase the conditioning flux to an even higher level than was possible with the maximum available value of $V_B$ applied to the border pilot cells.

The panel was therefore electrically reconnected so that every second cell in both directions was driven by $V_B$ and was in the on state. Thus a full one-fourth of the cells on the panel were driven by $V_B$. This is referred to as the full interlace point on the curve of FIG. 2. To minimize crosstalk interference between each pilot cell and its adjacent unlit cells, $V_B$ was restricted to about 165 volts. In spite of the reduced value of $V_B$, the substantial increase in the number of conditioning pilot cells and the immediate proximity of those cells to the selected test cell should have greatly increased the conditioning photon flux at the test cell. This increased flux resulted in a lowering of $V\omega_{100}$ by only a few volts, thereby indicating that saturated photon conditioning had been achieved by the original border pilot cells.

The data of FIG. 2 was obtained by means of a Baker, et al. gas discharge display/memory panel as described in FIGS. 3, 4, 5 and 6 hereinafter. The invention utilizes a pair of dielectric films 10 and 11 separated by a thin layer or volume of a gaseous discharge medium 12, the medium 12 producing a copious supply of charges (ions and electrons) which are alternately collectable on the surfaces of the dielectric members at opposed or facing elemental or discrete areas X and Y defined by the conductor matrix on non-gas-contacting sides of the dielectric members, each dielectric member presenting large open surface areas and a plurality of pairs of elemental X and Y areas. While the electrically operative structural members such as the dielectric members 10 and 11 and conductor matrixes 13 and 14 are all relatively thin (being exaggerated in thickness in the drawings) they are formed on and supported by rigid nonconductive support members 16 and 17 respectively.

Preferably, one or both of nonconductive support members 16 and 17 pass light produced by discharge in the elemental gas volumes. Preferably, they are transparent glass members and these members essentially define the overall thickness and strength of the panel. For example, the thickness of gas layer 12 as determined by spacer 15 is usually under 10 mils and preferably about 4 to 6 mils, dielectric layers 10 and 11 (over the conductors at the elemental or discrete X and Y areas) are usually between 1 and 2 mils thick, and conductors 13 and 14 about 8,000 angstroms thick. However, support members 16 and 17 are much thicker (particularly in larger panels) so as to provide as much ruggedness as may be desired to compensate for stresses in the panel. Support members 16 and 17 also serve as heat sinks for heat generated by discharges and thus minimize the effect of temperature on operation of the device. If it is desired that only the memory function be utilized, then none of the members need be transparent to light.

Except for being nonconductive or good insulators the electrical properties of support members 16 and 17 are not critical. The main function of support members 16 and 17 is to provide mechanical support and strength for the entire panel, particularly with respect to pressure differential acting on the panel and thermal shock. As noted earlier, they should have thermal expansion characteristics substantially matching the thermal expansion characteristics of dielectric layers 10 and 11. Ordinary ¼ inch commercial grade soda lime plate glasses have been used for this purpose. Other glasses such as low expansion glasses or transparent devitrified glasses can be used provided they can withstand processing and have expansion characteristics substantially matching expansion characteristics of the dielectric coatings 10 and 11. For given pressure differentials and thickness of plates, the stress and deflection of plates may be determined by following standard stress and strain formulas (see R. J. Roark, Formulas for Stress and Strain, McGraw-Hill, 1954).

Spacer 15 may be made of the same glass material as dielectric films 10 and 11 and may be an integral rib formed on one of the dielectric members and fused to the other members to form a bakeable hermetic seal enclosing and confining the ionizable gas volume 12. However, a separate final hermetic seal may be effected by a high strength devitrified glass sealant 15S. Tubulation 18 is provided for exhausting the space between dielectric members 10 and 11 and filling that space with the volume of ionizable gas. For large panels small beadlike solder glass spacers such as shown at 15B may be located between conductor intersections and fused to dielectric member 10 and 11 to aid in withstanding stress on the panel and maintain uniformity of thickness of gas volume 12.

Conductor arrays 13 and 14 may be formed on support members 16 and 17 by a number of well-known processes, such as photoetching, vacuum deposition, stencil screening, etc. In the panel shown in FIG. 4, the center-to-center spacing of conductors in the respective arrays is about 17 mils. Transparent or semi-transparent conductive material such as tin oxide, gold or aluminum can be used to form the conductor arrays and should have a resistance less than 3000 ohms per line. Narrow opaque electrodes may alternately be used so that discharge light passes around the edges of the electrodes to the viewer. It is important to select a conductor material that is not attacked during processing by the dielectric material.

It will be appreciated that conductor arrays 13 and 14 may be wires or filaments of copper, gold, silver or aluminum or any other conductive metal or material. For example 1 mil wire filaments are commercially available and may be used in the invention. However, formed in situ conductor arrays are preferred since they may be more easily and uniformly placed on and adhered to the support plates 16 and 17.

Dielectric layer members 10 and 11 are formed of an inorganic material and are preferably formed in situ as an adherent film or coating which is not chemically or physically effected during bake-out of the panel. One such material is a solder glass such as Kimble SG-68 manufactured by and commercially available from the assignee of the present invention.

This glass has thermal expansion characteristics substantially matching the thermal expansion characteristics of certain soda-lime glasses, and can be used as the dielectric layer when the support members 16 and 17 are soda-lime glass plates. Dielectric layers 10 and 11 must be smooth and have a dielectric strength of about 1000 v. and be electrically homogeneous on a microscopic scale (e.g., no cracks, bubbles, crystals, dirt, surface films, etc.). In addition, the surfaces of dielectric layers 10 and 11 should be good photoemitters of electrons in a baked out condition. Alternatively, dielectric layers 10 and 11 may be overcoated with materials designed to produce good electron emission, as in U.S. Pat. No. 3,634,719, issued to Roger E. Ernsthausen. Of course, for an optical display at least one of dielectric layers 10 and 11 should pass light generated on discharge and be transparent or translucent and, preferably, both layers are optically transparent.

The preferred spacing between surfaces of the dielectric films is about 4 to 6 mils with conductor arrays 13 and 14 having center-to-center spacing of about 17 mils.

The ends of conductors 14-1 . . . 14-4 and support member 17 extend beyond the enclosed gas volume 12 and are exposed for the purpose of making electrical connection to interface and addressing circuitry 19. Likewise, the ends of conductors 13-1 . . . 13-4 on support member 16 extend beyond the enclosed gas volume 12 and are exposed for the purpose of making electrical connection to interface and addressing circuitry 19.

As in known display systems, the interface and addressing circuitry or system 19 may be relatively inexpensive line scan systems or the somewhat more expensive high speed random access systems. In either case, it is to be noted that a lower amplitude of operating potentials helps to reduce problems associated with the interface circuitry between the addressing system and the display/memory panel, per se. Thus, by providing a panel having greater uniformity in the discharge characteristics throughout the panel, tolerances and operating characteristics of the panel with which the interfacing circuitry cooperate, are made less rigid.

I claim:

1. In a process for conditioning the gaseous discharge medium of a plurality of to be addressed display cells for uniform operation at reduced voltage in the operation of a multiple gas discharge display/memory panel comprised of a matrix of display cells formed by opposing dielectric charge storage surfaces and electrode arrays, at least one cell being a pilot cell in the on-state for the photon conditioning of the other matrix display cells, the improvement wherein the sustaining voltage applied to each pilot cell is sufficiently greater in amplitude than the sustaining voltage applied to the other display cells so as to provide a conditioning photon flux sufficient to reduce the required write voltage of the other display cells to a minimum level $V\omega_{100}$ such that the provision of additional conditioning photons would not significantly further reduce the amplitude of the required writing pulse.

2. The invention of claim 1 wherein a plurality of pilot cells are located in the border of the matrix.

3. A method of determining the minimum voltage $V\omega_{100}$ for saturation photon conditioning of a plurality of cells in a matrix array in a gas discharge display panel said matrix array of cells being bounded by a plurality of pilot border discharge cells to which a write voltage $V_B$ is applied, comprising:

at a selected cell in said matrix array most remote from said pilot border, applying a write voltage of a selected magnitude great enough to turn on said selected cell, at said pilot-border cells applying a sustaining signal voltage to said pilot-border cells and then increasing said pilot border sustaining voltage $V_B$ and decreasing the write voltage to said selected cell until $V\omega_{100}$ is reached, wherein $V\omega_{100}$ is defined as the minimum write voltage amplitude sufficient to assure turn on substantially 100 percent of the time for said selected cell.

* * * * *